(12) United States Patent
Kolluri et al.

(10) Patent No.: US 9,842,649 B2
(45) Date of Patent: *Dec. 12, 2017

(54) RESISTANCE VARIABLE ELEMENT METHODS AND APPARATUSES

(71) Applicant: Micron Technology, Inc., Boise, ID (US)

(72) Inventors: Seshadri K. Kolluri, San Jose, CA (US); Rajesh N. Gupta, Devarabisnahalli (IN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/185,767

(22) Filed: Jun. 17, 2016

(65) Prior Publication Data

US 2016/0300610 A1 Oct. 13, 2016

Related U.S. Application Data

(63) Continuation of application No. 13/947,807, filed on Jul. 22, 2013, now Pat. No. 9,373,399.

(51) Int. Cl.
*G11C 11/00* (2006.01)
*G11C 13/00* (2006.01)
*G11C 11/56* (2006.01)

(52) U.S. Cl.
CPC ......... *G11C 13/0097* (2013.01); *G11C 11/56* (2013.01); *G11C 13/0069* (2013.01); *G11C 2013/0071* (2013.01); *G11C 2013/0092* (2013.01); *G11C 2213/79* (2013.01)

(58) Field of Classification Search
CPC ............ G11C 13/0097; G11C 13/0069; G11C 2013/0092; G11C 11/56; G11C 2013/0071; G11C 2213/79
See application file for complete search history.

(56) References Cited

U.S. PATENT DOCUMENTS

| | | | |
|---|---|---|---|
| 6,930,909 B2 | 8/2005 | Moore et al. | |
| 7,054,195 B2 | 5/2006 | Matsunaga | |
| 7,697,334 B2 | 4/2010 | Nakajima et al. | |
| 8,243,532 B2 | 8/2012 | Nirschl et al. | |
| 9,373,399 B2 | 6/2016 | Kolluri et al. | |

(Continued)

FOREIGN PATENT DOCUMENTS

WO WO-2015013128 A1 1/2015

OTHER PUBLICATIONS

"International Application Serial No. PCT/US2014/047176, International Search Report dated Oct. 27, 2014", 3 pgs.

(Continued)

*Primary Examiner* — Richard Elms
*Assistant Examiner* — Mohammed A Bashar
(74) *Attorney, Agent, or Firm* — Schwegman Lundberg & Woessner, P.A.

(57) ABSTRACT

Apparatus and methods are disclosed, including a method that performs a first operation on a first resistance variable element using a common source voltage, a first data line voltage and a first control gate voltage, and then performs a second operation on a second resistance variable element using the common source voltage, a second data line voltage and a second control gate voltage. Additional apparatus and methods are described.

11 Claims, 6 Drawing Sheets

(56) References Cited

U.S. PATENT DOCUMENTS

| | | |
|---|---|---|
| 2004/0264244 A1 | 12/2004 | Morimoto |
| 2008/0049487 A1 | 2/2008 | Yoshimura et al. |
| 2008/0106924 A1 | 5/2008 | Cho et al. |
| 2009/0059651 A1 | 3/2009 | Aoki |
| 2010/0080037 A1 | 4/2010 | Inoue et al. |
| 2010/0290271 A1* | 11/2010 | Lung .................. G11C 11/5614 365/163 |
| 2011/0051502 A1 | 3/2011 | Rao et al. |
| 2011/0058410 A1* | 3/2011 | Osabe ................ G11C 13/0004 365/163 |
| 2011/0149639 A1 | 6/2011 | Carter et al. |
| 2012/0294064 A1 | 11/2012 | Kitagawa et al. |
| 2012/0327701 A1 | 12/2012 | Nazarian |
| 2013/0121056 A1 | 5/2013 | Liu et al. |
| 2015/0023089 A1 | 1/2015 | Kolluri et al. |

OTHER PUBLICATIONS

"International Application Serial No. PCT/US2014/047176, Written Opinion dated Oct. 27, 2014", 8 pgs.

* cited by examiner

US 9,842,649 B2

RESISTANCE VARIABLE ELEMENT METHODS AND APPARATUSES

PRIORITY APPLICATION

This application is a continuation of U.S. application Ser. No. 13/947,807, filed Jul. 22, 2013, now issued as U.S. Pat. No. 9,373,399, which is incorporated herein by reference in its entirety.

BACKGROUND

Semiconductor memory devices are used in many electronic devices such as personal digital assistants (PDAs), laptop computers, mobile phones and digital cameras. Some of these semiconductor memory devices have arrays of resistance variable memory cells.

BRIEF DESCRIPTION OF THE DRAWINGS

Some embodiments are illustrated by way of example and not limitation in the figures of the accompanying drawings in which.

DETAILED DESCRIPTION

Figure 1:
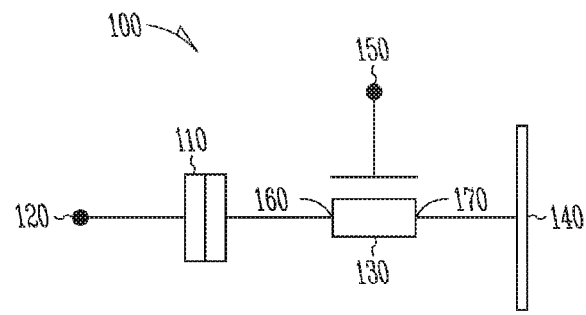
FIG. 1 is an electrical schematic diagram of an apparatus in the form of a resistance variable memory cell according to various embodiments of the invention.

For the purposes of this document, an "apparatus" can refer to any of a number of structures, such as circuitry, a device or a system. In this description, a transistor is described as being switched on to assume an activated state when it is rendered conductive by a control gate voltage. The transistor is described as being switched off to assume an inactive state when it is rendered non-conductive by a control gate voltage. Potentials refer to electrical potentials.

A resistance variable memory cell has an architecture in which resistance states of a resistance variable element correspond to stored data. The resistance states can include a low resistance state (LRS) and a high resistance state (HRS). A resistance variable element with multiple material regions can have more than two resistance states. First data may be written by applying a predetermined drive current to a resistance variable memory cell in a first direction. Writing the first data may also be called programming the resistance variable memory cell or setting the resistance variable memory cell, both of which being referred to hereinafter as programming the resistance variable memory cells. Second data may be written by applying a predetermined drive current to the resistance variable memory cell in a second direction opposite to the first direction. Writing the second data may also be called erasing the resistance variable memory cell or resetting the resistance variable memory cell, both of which being referred to hereinafter as erasing the resistance variable memory cell. Resistance variable memory cells can be arranged in a resistive random access memory (RRAM) device.

Resistance variable memory cells can be programmed or erased with a substantial drive current through an access device. The access device may be a field-effect transistor (FET), for example. Many RRAM memory array architectures have a common source design in which a potential of a common source may be substantially constant during both program and erase operations to reduce power dissipation and write delay. A potential may be substantially constant if it does not change more than 0.2 volts in either a positive or a negative direction. The potential of the common source can have a minimum limit based on characteristics of the access device and a voltage used to program or erase the resistance variable element. A non-zero potential on the common source can reduce current in the access device in an RRAM memory cell. The potential on the common source can reduce an effective gate-source voltage of the access device and increase the threshold voltage of the access device due to a reverse bias between source and body terminals of the access device. The substantially constant potential of the common source during program and erase operations can limit the drive current in at least one of the operations. The challenge noted above, as well as others, can be addressed by programming or erasing the resistance variable memory cells in two acts. A control gate voltage of the access device is raised for an erase operation when a data line (e.g., a bit line) is at a higher potential with respect to the common source. The control gate voltage is lowered for a program operation when the data line is at a lower potential with respect to the common source.

FIG. 1 is an electrical schematic diagram of an apparatus in the form of a resistance variable memory cell 100 according to various embodiments of the invention. The resistance variable memory cell 100 includes a resistance variable element 110 coupled between a data (e.g., bit) line 120 and an access device 130. A data line voltage may be provided on the data line 120 when an operation is performed on the resistance variable element 110. The access device 130 is coupled between the resistance variable element 110 and a common source 140 (e.g., a common source plate, a common source line, a common source slot or other common source structure). The access device 130 is a FET and in particular an n-channel FET. The access device 130 includes a gate terminal 150 coupled to an access (e.g., word) line (not shown), a first terminal 160 coupled to the resistance variable element 110 and a second terminal 170 coupled to the source 140. The access device 130 can be controlled by a control gate voltage on the gate terminal 150 and provided on the access line. The source 140 may be coupled to thousands or millions of other resistance variable memory cells and can have a common source voltage that is substantially constant. The access device 130 may allow current to flow between the data line 120 and the source 140 when it is switched on by the potential on its gate terminal 150. The first terminal 160 can be a drain or a source and the second terminal 170 can be a drain or a source depending on the direction of current in the access device 130. The data line 120 may be used to sense (e.g., read) a data state of the resistance variable element 110. The data state of the resistance variable element 110 can be read by measuring a resistance value of the resistance variable element 110 which can include sensing a value of a current flowing through the resistance variable element 110.

Figure 2:
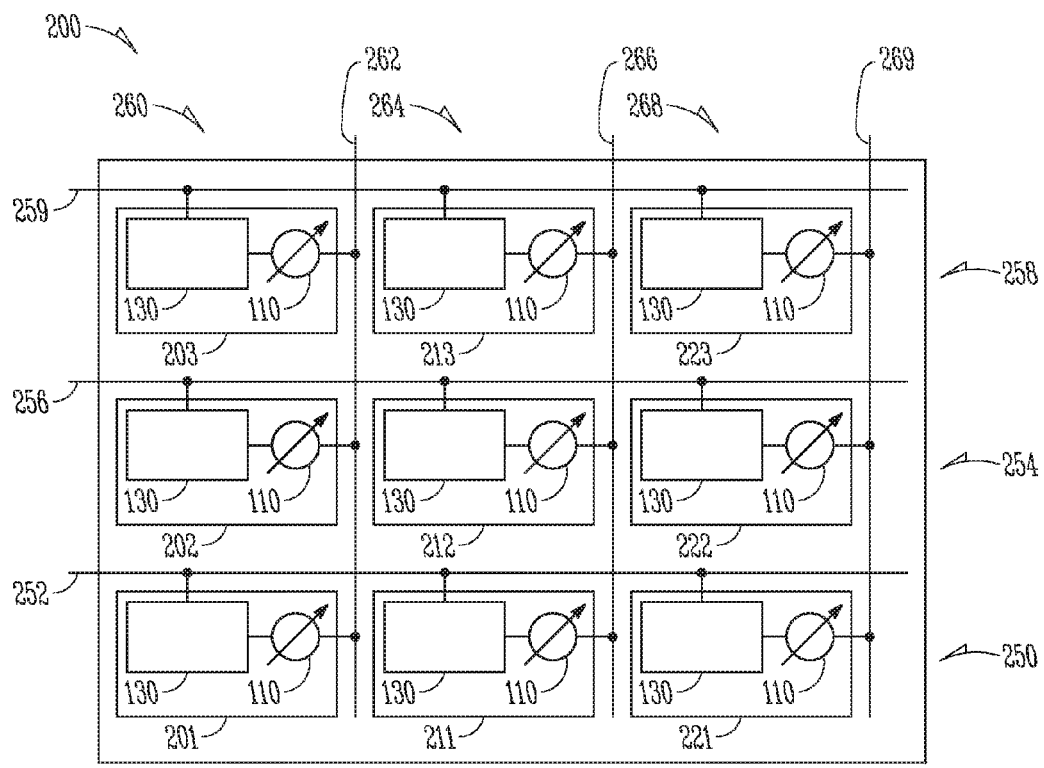
FIG. 2 is an electrical schematic diagram of an apparatus in the form of a portion of an array of resistance variable memory cells according to various embodiments of the invention.

FIG. 2 is an electrical schematic diagram of an apparatus in the form of a portion of an array 200 of resistance variable memory cells according to various embodiments of the invention. The array 200 can be formed on a semiconductor substrate (not shown). The array 200 includes resistance variable memory cells 201, 202, 203, 211, 212, 213, 221, 222 and 223. Each of the resistance variable memory cells 201-223 may be similar or identical to the resistance variable memory cell 100 shown in FIG. 1 and includes the access device 130 coupled to the resistance variable element 110.

The resistance variable memory cells 201, 211 and 221 are in a first row 250 and the access devices 130 of the resistance variable memory cells 201, 211 and 221 are coupled to a first access line 252. The resistance variable memory cells 202, 212 and 222 are in a second row 254 and the access devices 130 of the resistance variable memory cells 202, 212 and 222 are coupled to a second access line 256. The resistance variable memory cells 203, 213 and 223 are in a third row 258 and the access devices 130 of the resistance variable memory cells 203, 213 and 223 are coupled to a third access line 259.

The resistance variable memory cells 201, 202 and 203 are in a first column 260 and the resistance variable elements 110 of the resistance variable memory cells 201, 202 and 203 are coupled to a first data line 262. The resistance variable memory cells 211, 212 and 213 are in a second column 264 and the resistance variable elements 110 of the resistance variable memory cells 211, 212 and 213 are coupled to a second data line 266. The resistance variable memory cells 221, 222 and 223 are in a third column 268 and the resistance variable elements 110 of the resistance variable memory cells 221, 222 and 223 are coupled to a third data line 269. The array 200 may have more or less than the nine resistance variable memory cells 201-223 shown in FIG. 2.

With reference to FIG. 1 and FIG. 2, the resistance variable memory cell 100 can be programmed to store a first value (e.g., a logic "1") by driving a first current through the resistance variable element 110 in a first direction. The resistance variable memory cell 100 can be erased to store a second value (e.g., a logic "0") by driving a second current through the resistance variable element 110 in a second direction opposite to the first direction. The second current may be substantially equal to the first current. The access device 130 is biased to conduct the first current in the first direction and the second current in the second direction. The gate terminal 150 can be biased by a first control gate voltage during programming of the first value and by a different second control gate voltage during erasing to the second value to provide sufficient drive current through the resistance variable element 110. Two or more of the resistance variable memory cells 201-223 may be programmed or erased at the same time with the same voltage on one or more of the access lines 252, 256 and 259. The first value is programmed into one or more of the resistance variable memory cells 100 at a first time, and one or more of the resistance variable memory cells 100 is erased to store the second value at a second time.

Figure 3:
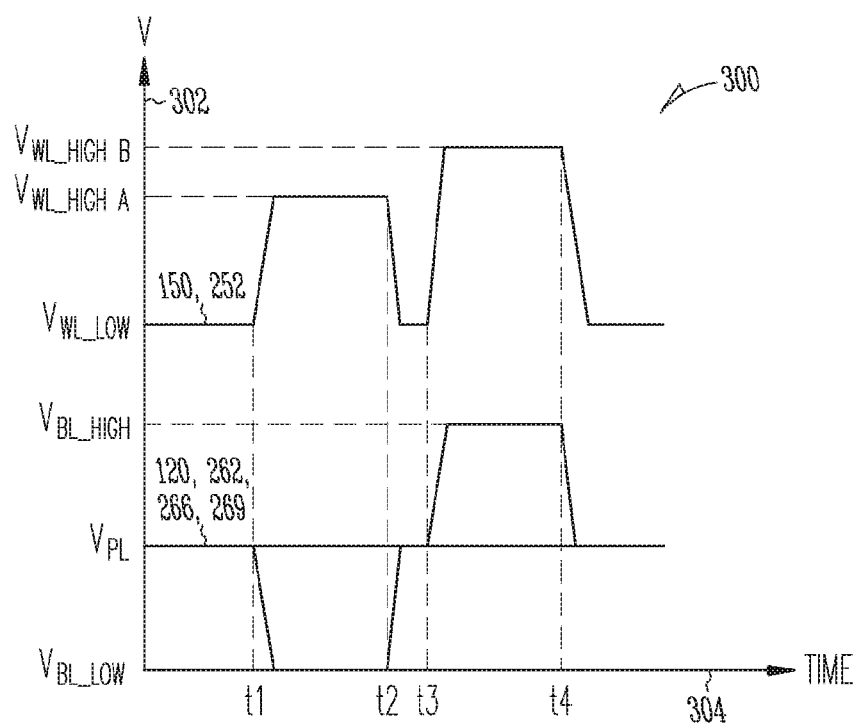
FIG. 3 is a timing diagram for the array of FIG. 2 according to various embodiments of the invention where each of the resistance variable memory cells may be similar or identical to the resistance variable memory cell shown in FIG. 1.

FIG. 3 is a timing diagram 300 for the array 200 of FIG. 2 according to various embodiments of the invention where each of the resistance variable memory cells 201-223 may be similar or identical to the resistance variable memory cell 100 shown in FIG. 1. The timing diagram 300 illustrates voltages in the array 200 during a programming operation and/or an erasing operation for the resistance variable memory cells 201, 211 and 221 in the first row 250. The voltages are represented on a vertical axis 302 and time t is represented on a horizontal axis 304. Data line voltages on the data lines 120, 262, 266 and 269 are illustrated at the bottom of the timing diagram 300. A control gate voltage on the access line 252 and the gate terminals 150 of the access devices 130 is illustrated above the data line voltages. Control gate voltages on the access lines 256 and 259 may be the same as the control gate voltage on the access line 252.

The control gate voltage on the access line 252 is at $V_{WL\_low}$ which can be a reference voltage (e.g., ground) before programming begins. Programming begins at a time t1 when the control gate voltage on the access line 252 rises to a first pulse at a voltage $V_{WL\_highA}$ which is sufficient to switch on the access device 130 to program the first value into one or more of the resistance variable memory cells 201-223. Each pulse comprises a raised (or lowered) electrical potential of a limited duration. One or more of the data lines 262, 266 and 269 are held at a standby data line voltage. The standby data line voltage can be substantially equal to a source voltage $V_{PL}$ which is the potential of the source 140 such that none of the resistance variable memory cells 201-223 coupled to a data line 262, 266 and 269 at the source voltage $V_{PL}$ is programmed or erased. One or more of the data lines 262, 266 and 269 are brought to a lower voltage $V_{BL\_low}$ at the time t1 to program the resistance variable memory cells 201, 211 and 221 coupled to the data lines 262, 266 and 269 at $V_{BL\_low}$ to the first value. The voltage $V_{BL\_low}$ is lower than the source voltage $V_{PL}$. The pulse on the access line 252 ends at a time t2 when the potential of the access line 252 falls to $V_{WL\_low}$. The potential of the data lines 262, 266 and 269 (at $V_{BL\_low}$) is raised to the source voltage $V_{PL}$ at the time t2 to end the programming. One or more of the resistance variable memory cells 201, 211 and 221 is programmed to the first value during the pulse on the access line 252 between the times t1 and t2.

Erasing begins at a time t3 when the control gate voltage on the access line 252 rises from $V_{WL\_low}$ to begin a second pulse at a voltage $V_{WL\_highB}$ which is sufficient to switch on the access device 130 to erase the second value into one or more of the resistance variable memory cells 201-223. The voltage $V_{WL\_highB}$ is higher than the voltage $V_{WL\_highA}$. A difference between the voltage $V_{WL\_highA}$ and the voltage $V_{WL\_highB}$ is less than or equal to the source voltage $V_{PL}$.

The voltage $V_{WL\_highB}$ may be substantially equal to the voltage $V_{WL\_highA}$ plus the source voltage $V_{PL}$. A first voltage may be substantially equal to a second voltage if it does not differ from the second voltage by more than 0.2 volts. One or more of the data lines 262, 266 and 269 are held at the source voltage $V_{PL}$ such that none of the resistance variable memory cells 201-223 coupled to a data line 262, 266 and 269 at the source voltage $V_{PL}$ is erased. One or more of the data lines 262, 266 and 269 are raised to a higher voltage $V_{BL\_high}$ at the time t3 to erase one or more of the resistance variable memory cells 201, 211 and 221 coupled to the data lines 262, 266 and 269 at $V_{BL\_high}$ to the second value. The voltage $V_{BL\_high}$ is higher than the source voltage $V_{PL}$. The pulse on the access line 252 ends and the potential of the data lines 262, 266 and 269 at $V_{BL\_high}$ is lowered to the source voltage $V_{PL}$ at a time t4 to end the erase. One or more of the resistance variable memory cells 201, 211 and 221 is erased to the second value during the pulse on the access line 252 between the times t3 and t4. The resistance variable memory cells 201, 211 and 221 that were erased to the second value between the times t3 and t4 may be the same or different than the resistance variable memory cells 201, 211 and 221 programmed to the first value between the times t1 and t2.

Specific values of the voltages shown in the timing diagram 300 resistance variable memory cell 100 are listed in TABLE I according to various embodiments of the invention:

TABLE I

| SIGNAL | VOLTS |
|---|---|
| $V_{PL}$ | 1.5 |
| $V_{BL\_low}$ | 0 |
| $V_{BL\_high}$ | 3 |
| $V_{WL\_low}$ | 0 |
| $V_{WL\_highA}$ | 4.5 |
| $V_{WL\_highB}$ | 6 |

The voltages listed in TABLE I show that the source 140 is at approximately 1.5 volts through the acts of programming and erasing. With respect to FIG. 1, the gate terminal 150 is at approximately 4.5 volts and the data line 120 is at approximately 0 volts when the resistance variable element 110 is being programmed between the times t1 and t2 to store the first value. Current flows from the source 140 to the data line 120, and the terminal 160 is the source such that a gate-source voltage difference $V_{GS}$ is approximately 4.5 volts for the access device 130. The gate terminal 150 is at approximately 6 volts and the data line 120 is at approximately 3 volts when the resistance variable element 110 is being erased between the times t3 and t4 to store the second value. Current flows from the data line 120 to the source 140, and the terminal 170 is the source such that the gate-source voltage difference $V_{GS}$ is approximately 4.5 volts for the access device 130. Through the acts of programming and erasing the gate-source voltage difference $V_{GS}$ is not substantially higher than approximately 4.5 volts so that the access device 130 is not compromised.

Figure 4:
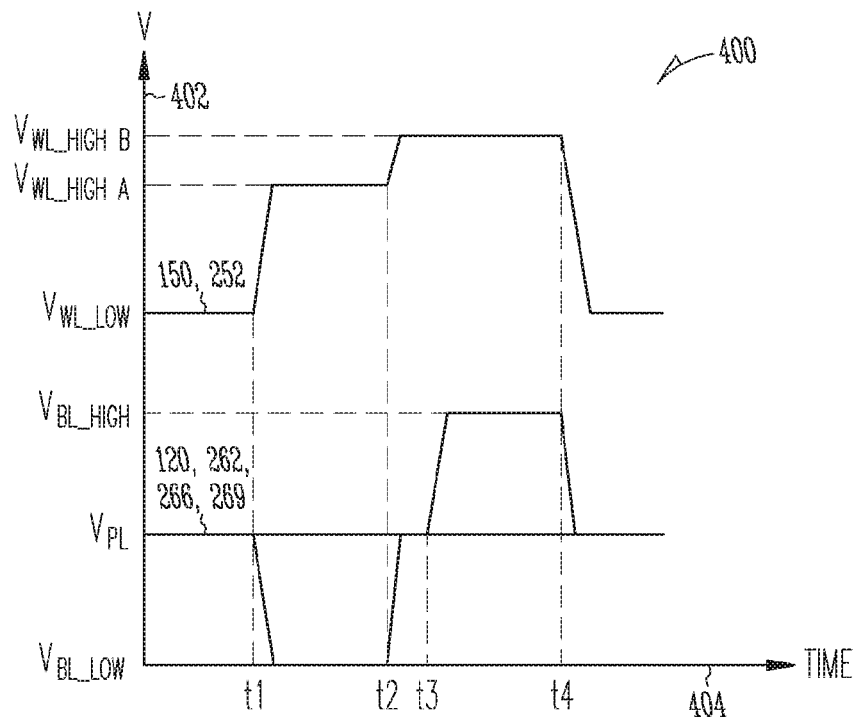
FIG. 4 is a timing diagram for the array of FIG. 2 according to various embodiments of the invention where each of the resistance variable memory cells may be similar or identical to the resistance variable memory cell shown in FIG. 1.

FIG. 4 is a timing diagram 400 for the array 200 of FIG. 2 according to various embodiments of the invention where each of the resistance variable memory cells 201-223 may be similar or identical to the resistance variable memory cell 100 shown in FIG. 1. The timing diagram 400 illustrates voltages in the array 200 during programming and erasing for the resistance variable memory cells 201, 211 and 221 in the first row 250. The voltages are represented on a vertical axis 402 and time t is represented on a horizontal axis 404. Data line voltages on the data lines 262, 266 and 269 are illustrated at the bottom of the timing diagram 400. A control gate voltage on the access line 252 and the gate terminals 150 of the access devices 130 is illustrated above the data line voltages. Control gate voltages on the access lines 256 and 259 may be the same as the control gate voltage on the access line 252.

The resistance variable memory cells 201, 211 and 221 are programmed and/or erased according to the timing diagram 400 to store the same values that were programmed and/or erased according to the timing diagram shown in FIG. 3. The voltages on the data lines 262, 266 and 269 in timing diagram 400 are similar to the voltages on the data lines 262, 266 and 269 in timing diagram 300 and will not be further described for purposes of brevity and clarity. The difference is that the pulses on the access line 252 are merged into a single signal from the time t1 to the time t4. In other words, instead of returning the control gate voltage to $V_{WL\_low}$ between times t2 and t3, the control gate voltage is simply raised from $V_{WL\_highA}$ to $V_{WL\_highB}$.

All of the resistance variable memory cells that are being programmed may be programmed at the same time with a first control gate voltage. All of the resistance variable memory cells that are being erased may be erased at the same time with a second control gate voltage according to various embodiments of the invention.

Figure 5:
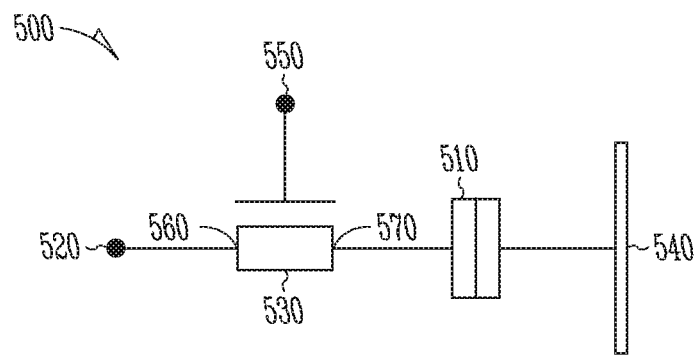
FIG. 5 is an electrical schematic diagram of an apparatus in the form of a resistance variable memory cell according to various embodiments of the invention.

FIG. 5 is an electrical schematic diagram of an apparatus in the form of a resistance variable memory cell 500 according to various embodiments of the invention. The resistance variable memory cell 500 includes a resistance variable element 510. A data line 520 is coupled to an access device 530, and the access device 530 is coupled to the resistance variable element 510. A data line voltage may be provided on the data line 520 when an operation is performed on the resistance variable element 510. In contrast to the embodiment of FIG. 1, the resistance variable element 510 is coupled between the access device 530 and a common source 540. The access device 530 is a FET and in particular an n-channel FET. The access device 530 includes a gate terminal 550 coupled to an access line (not shown), a first terminal 560 coupled to the data line 520 and a second terminal 570 coupled to the resistance variable element 510. The access device 530 can be controlled by a control gate voltage on the gate terminal 550 and provided on the access line. The source 540 may be coupled to thousands or millions of other resistance variable memory cells and can have a common source voltage that is substantially constant. The access device 530 may allow current to flow between the data line 520 and the source 540 when it is switched on by the potential on its gate terminal 550. The first terminal 560 can be a drain or a source and the second terminal 570 can be a drain or a source depending on the direction of current in the access device 530. The data line 520 may be used to sense a data state of the resistance variable element 510. The data state of the resistance variable element 510 can be read by measuring a resistance value of the resistance variable element 510 which can include sensing a value of a current flowing through the resistance variable element 510. Each of the resistance variable memory cells 201-223 in the array 200 shown in FIG. 2 may be similar or identical to the resistance variable memory cell 500 shown in FIG. 5 and includes the access device 530 coupled to the resistance variable element 510.

The resistance variable memory cell 500 can be programmed or erased according to the timing diagrams 300 and 400 shown in FIGS. 3 and 4 although the voltages are different than the voltages shown in Table I. Specific values of the voltages shown in the timing diagrams 300 and 400 for the resistance variable memory cell 500 are listed in TABLE II according to various embodiments of the invention:

TABLE II

| SIGNAL | VOLTS |
|---|---|
| $V_{PL}$ | 1.5 |
| $V_{BL\_low}$ | 0 |
| $V_{BL\_high}$ | 3 |
| $V_{WL\_low}$ | 0 |
| $V_{WL\_highA}$ | 4.5 |
| $V_{WL\_highB}$ | 6.4 |

The voltages listed in TABLE II show that the source 540 is at approximately 1.5 volts through the acts of programming and erasing. With respect to FIG. 5, the gate terminal 550 is at approximately 4.5 volts and the data line 520 is at approximately 0 volts when the resistance variable element 510 is being programmed between the times t1 and t2 to store the first value. Current flows from the source 540 to the data line 520, and the terminal 560 is the source such that a gate-source voltage difference $V_{GS}$ is approximately 4.5 volts for the access device 530. The gate terminal 550 is at approximately 6.4 volts and the data line 520 is at approximately 3 volts when the resistance variable element 510 is being erased between the times t3 and t4 to store the second value. Assuming a voltage drop of about 0.4V on the resistance variable element 510, the gate to source voltage in this case is approximately 4.5V. Current flows from the data line 520 to the source 540, and the terminal 570 is the source such that the gate-source voltage difference $V_{GS}$ is approximately 4.5 volts for the access device 530. Through the acts of programming and erasing the gate-source voltage difference $V_{GS}$ is not substantially higher than approximately 4.5 volts so that the access device 530 is not compromised.

Figure 6:
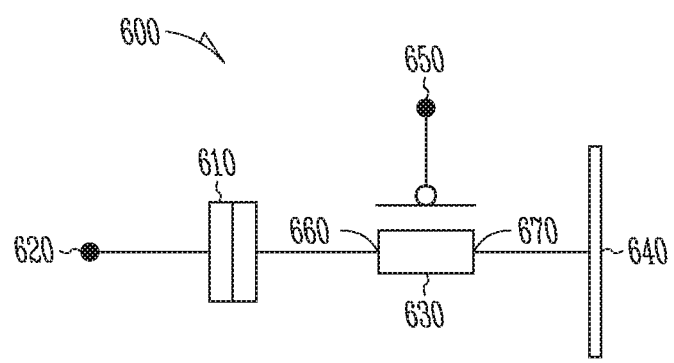
FIG. 6 is an electrical schematic diagram of an apparatus in the form of a resistance variable memory cell according to various embodiments of the invention.

A resistance variable memory cell may have an access device that is a p-channel FET. FIG. 6 is an electrical schematic diagram of an apparatus in the form of a resistance variable memory cell 600 according to various embodiments of the invention. The resistance variable memory cell 600 includes a resistance variable element 610 coupled between a data line 620 and an access device 630. A data line voltage may be provided on the data line 620 when an operation is performed on the resistance variable element 610. The access device 630 is coupled between the resistance variable element 610 and a common source 640. The access device 630 is a FET and in particular a p-channel FET. The access device 630 includes a gate terminal 650 coupled to an access line (not shown), a first terminal 660 coupled to the resistance variable element 610 and a second terminal 670 coupled to the source 640. The access device 630 can be controlled by a control gate voltage on the gate terminal 650 and provided on the access line. The source 640 may be coupled to hundreds or thousands of other resistance variable memory cells and can have a common source voltage that is substantially constant. The access device 630 may allow current to flow between the data line 620 and the source 640 when it is switched on by the potential on its gate terminal 650. The first terminal 660 can be a drain or a source and the second terminal 670 can be a drain or a source depending on the direction of current in the access device 630. The data line 620 may be used to sense a data state of the resistance variable element 610. The data state of the resistance variable element 610 can be read by measuring a resistance value of the resistance variable element 610 which can include sensing a value of a current flowing through the resistance variable element 610. Each of the resistance variable memory cells 201-223 in the array 200 shown in FIG. 2 may be similar or identical to the resistance variable memory cell 600 shown in FIG. 6 and includes the access device 630 coupled to the resistance variable element 610.

Figure 7:
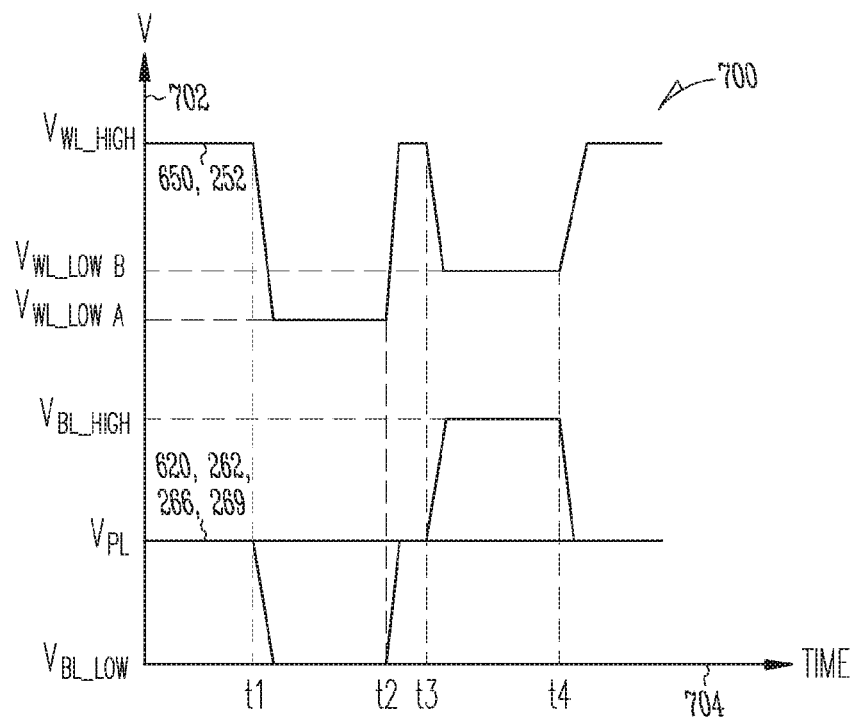
FIG. 7 is a timing diagram for the array 200 of FIG. 2 according to various embodiments of the invention where each of the resistance variable memory cells may be similar or identical to the resistance variable memory cell shown in FIG. 6.

FIG. 7 is a timing diagram 700 for the array 200 of FIG. 2 according to various embodiments of the invention where each of the resistance variable memory cells 201-223 may be similar or identical to the resistance variable memory cell 600 shown in FIG. 6. The timing diagram 700 illustrates voltages in the array 200 during a programming operation and/or an erasing operation for the resistance variable memory cells 201, 211 and 221 in the first row 250. The voltages are represented on a vertical axis 702 and time t is represented on a horizontal axis 704. Data line voltages on the data lines 620, 262, 266 and 269 are illustrated at the bottom of the timing diagram 700. A control gate voltage on the access line 252 and the gate terminals 650 of the access devices 630 are illustrated above the data line voltages. Control gate voltages on the access lines 256 and 259 may be the same as the control gate voltage on the access line 252.

The control gate voltage on the access line 252 is at $V_{WL\_high}$ which can be $V_{BL\_high}$ or a supply voltage Vcc before programming begins. Programming begins at a time t1 when the control gate voltage on the access line 252 falls to a first pulse at a voltage $V_{WL\_lowA}$ which is sufficient to switch on the access devices 630 to program the first value into one or more of the resistance variable memory cells 201-223. One or more of the data lines 262, 266 and 269 are held at a standby data line voltage. The standby data line voltage can be substantially equal to a source voltage $V_{PL}$ (the potential of the source 640) such that none of the resistance variable memory cells 201-223 coupled to a data line 262, 266 and 269 at the source voltage $V_{PL}$ is programmed. One or more of the data lines 262, 266 and 269 are brought to a lower voltage $V_{BL\_low}$ at the time t1 to program the resistance variable memory cells 201, 211 and 221 coupled to the data lines 262, 266 and 269 at $V_{BL\_low}$ to the first value. The voltage $V_{BL\_low}$ is lower than the source voltage $V_{PL}$. The pulse on the access line 252 ends at a time t2 when the potential of the access line 252 rises to $V_{WL\_low}$. The potential of the data lines 262, 266 and 269 at $V_{BL\_low}$ is raised to the source voltage $V_{PL}$ at the time t2 to end the programming. One or more of the resistance variable memory cells 201, 211 and 221 is programmed to the first value during the pulse on the access line 252 between the times t1 and t2.

Erasing begins at a time t3 when the control gate voltage on the access line 252 falls from $V_{WL\_high}$ to begin a second pulse at a voltage $V_{WL\_lowB}$ which is sufficient to switch on the access devices 630 to erase the second value into one or more of the resistance variable memory cells 201-223. The voltage $V_{WL\_lowB}$ is higher than the voltage $V_{WL\_lowA}$. A difference between the voltage $V_{WL\_lowA}$ and the voltage $V_{WL\_lowB}$ is less than or equal to the source voltage $V_{PL}$. The voltage $V_{WL\_lowB}$ may be substantially equal to the voltage $V_{WL\_lowA}$ plus the source voltage $V_{PL}$. One or more of the data lines 262, 266 and 269 are held at the source voltage $V_{PL}$ such that none of the resistance variable memory cells 201-223 coupled to a data line 262, 266 and 269 at the source voltage $V_{PL}$ is erased. One or more of the data lines 262, 266 and 269 are raised to a higher voltage $V_{BL\_high}$ at the time t3 to erase one or more of the resistance variable memory cells 201, 211 and 221 coupled to the data lines 262, 266 and 269 at $V_{BL\_high}$ to the second value. The voltage $V_{BL\_high}$ is higher than the source voltage $V_{PL}$. The pulse on the access line 252 ends and the potential of the data lines 262, 266 and 269 at $V_{BL\_high}$ is lowered to the source voltage $V_{PL}$ at a time t4 to end the erase. One or more of the resistance variable memory cells 201, 211 and 221 is erased to the second value during the pulse on the access line 252 between the times t3 and t4. The resistance variable memory cells 201, 211 and 221 that were erased to the second value between the times t3 and t4 may be the same or different than the resistance variable memory cells 201, 211 and 221 programmed to the first value between the times t1 and t2.

Specific values of the voltages shown in the timing diagram 700 resistance variable memory cell 600 are listed in TABLE III according to various embodiments of the invention:

TABLE III

| SIGNAL | VOLTS |
|---|---|
| $V_{PL}$ | 1.5 |
| $V_{BL\_low}$ | 0 |
| $V_{BL\_high}$ | 3 |
| $V_{WL\_high}$ | 3 |
| $V_{WL\_lowA}$ | −3 |
| $V_{WL\_lowB}$ | −1.5 |

The voltages listed in TABLE III show that the source 640 is at approximately 1.5 volts through the acts of programming and erasing. With respect to FIG. 6, the gate terminal 650 is at approximately −3 volts and the data line 620 is at approximately 0 volts when the resistance variable element 610 is being programmed between the times t1 and t2 to store the first value. Current flows from the source 640 to the data line 620, and the terminal 670 is the source such that a gate-source voltage difference $V_{GS}$ is approximately −4.5 volts for the access device 630. The gate terminal 650 is at approximately −1.5 volts and the data line 120 is at approximately 3 volts when the resistance variable element 610 is being erased between the times t3 and t4 to store the second value. Current flows from the data line 620 to the source 640, and the terminal 660 is the source such that the gate-source voltage difference $V_{GS}$ is approximately −4.5 volts for the access device 630. Through the acts of programming and erasing the gate-source voltage difference $V_{GS}$ is not substantially lower than approximately −4.5 volts so that the access device 630 is not compromised.

Figure 8:
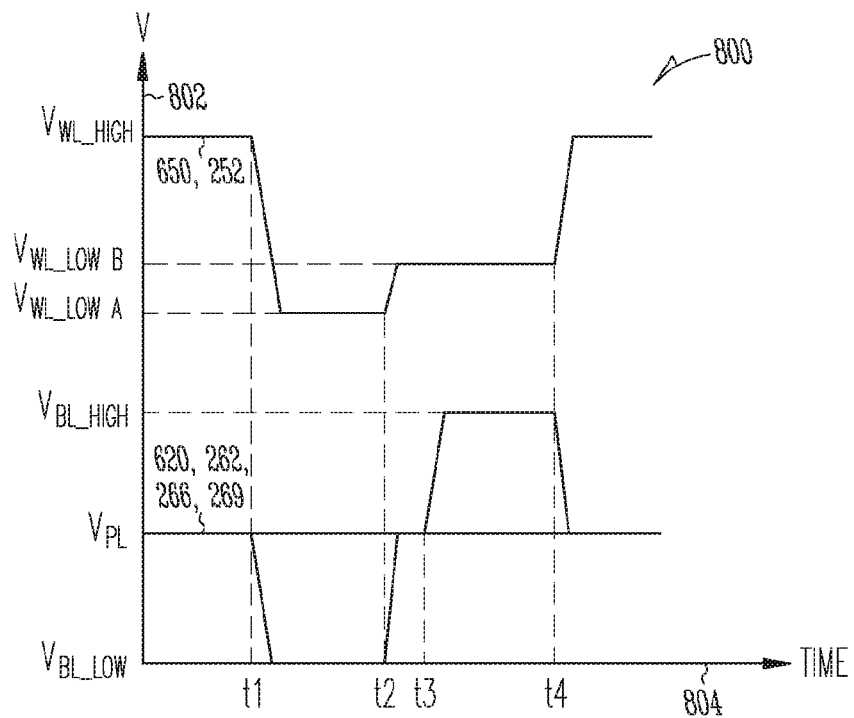
FIG. 8 is a timing diagram for the array of FIG. 2 according to various embodiments of the invention where each of the resistance variable memory cells may be similar or identical to the resistance variable memory cell shown in FIG. 6.

FIG. 8 is a timing diagram 800 for the array 200 of FIG. 2 according to various embodiments of the invention where each of the resistance variable memory cells 201-223 may be similar or identical to the resistance variable memory cell 600 shown in FIG. 6. The timing diagram 800 illustrates voltages in the array 200 during programming and erasing for the resistance variable memory cells 201, 211 and 221 in the first row 250. The voltages are represented on a vertical axis 802 and time t is represented on a horizontal axis 804. Data line voltages on the data lines 262, 266 and 269 are illustrated at the bottom of the timing diagram 800. A control gate voltage on the access line 252 and the gate terminals 650 of the access devices 630 are illustrated above the data line voltages. Control gate voltages on the access lines 256 and 259 may be the same as the control gate voltage on the access line 252.

The resistance variable memory cells 201, 211 and 221 are programmed and/or erased according to the timing diagram 800 to store the same values that were programmed and/or erased according to the timing diagram shown in FIG. 7. The voltages on the data lines 262, 266 and 269 in timing diagram 800 are similar to the voltages on the data lines 262, 266 and 269 in timing diagram 700 and will not be further described for purposes of brevity and clarity. The difference is that the pulses on the access line 252 are merged into a single signal from the time t1 to the time t4. In other words, instead of returning the control gate voltage to $V_{WL\_low}$ between times t2 and t3, the control gate voltage is simply raised from $V_{WL\_lowA}$ to $V_{WL\_lowB}$.

Figure 9:
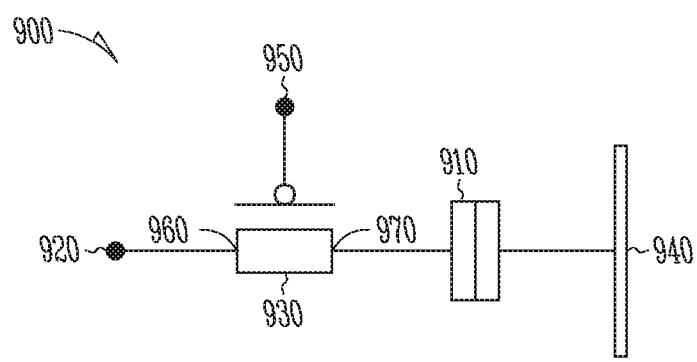
FIG. 9 is an electrical schematic diagram of an apparatus in the form of a resistance variable memory cell according to various embodiments of the invention.

FIG. 9 is an electrical schematic diagram of an apparatus in the form of a resistance variable memory cell 900 according to various embodiments of the invention. The resistance variable memory cell 900 includes a resistance variable element 910. A data line 920 is coupled to an access device 930, and the access device 930 is coupled to the resistance variable element 910. A data line voltage may be provided on the data line 920 when an operation is performed on the resistance variable element 910. In contrast to the embodiment of FIG. 1, the resistance variable element 910 is coupled between the access device 930 and a common source 940. The access device 930 is a FET and in particular a p-channel FET. The access device 930 includes a gate terminal 950 coupled to an access line (not shown), a first terminal 960 coupled to the data line 920 and a second terminal 970 coupled to the resistance variable element 910. The access device 930 can be controlled by a control gate voltage on the gate terminal 950 and provided on the access line. The source 940 may be coupled to thousands or millions of other resistance variable memory cells and can have a common source voltage that is substantially constant. The access device 930 may allow current to flow between the data line 920 and the source 940 when it is switched on by the potential on its gate terminal 950. The first terminal 960 can be a drain or a source and the second terminal 970 can be a drain or a source depending on the direction of current in the access device 930. The data line 920 may be used to sense a data state of the resistance variable element 910. The data state of the resistance variable element 910 can be read by measuring a resistance value of the resistance variable element 910 which can include sensing a value of a current flowing through the resistance variable element 910. Each of the resistance variable memory cells 201-223 in the array 200 shown in FIG. 2 may be similar or identical to the resistance variable memory cell 900 shown in FIG. 9 and includes the access device 930 coupled to the resistance variable element 910.

The resistance variable memory cell 900 can be programmed or erased according to the timing diagrams 700 and 800 shown in FIGS. 7 and 8 although the voltages are different than the voltages shown in Table III. Specific values of the voltages shown in the timing diagrams 700 and 800 for the resistance variable memory cell 900 are listed in TABLE IV according to various embodiments of the invention:

TABLE IV

| SIGNAL | VOLTS |
|---|---|
| $V_{PL}$ | 1.5 |
| $V_{BL\_low}$ | 0 |
| $V_{BL\_high}$ | 3 |
| $V_{WL\_high}$ | 3 |
| $V_{WL\_lowA}$ | −3.4 |
| $V_{WL\_lowB}$ | −1.5 |

The voltages listed in TABLE IV show that the source 940 is at approximately 1.5 volts through the acts of programming and erasing. With respect to FIG. 9, the gate terminal 950 is at approximately −3.4 volts and the data line 920 is at approximately 0 volts when the resistance variable element 910 is being programmed between the times t1 and t2 to store the first value. Current flows from the source 940 to the data line 920, and the terminal 970 is the source such that a gate-source voltage difference $V_{GS}$ is approximately −4.5 volts for the access device 930. The gate terminal 950 is at approximately −1.5 volts and the data line 920 is at approximately 3 volts when the resistance variable element 910 is being erased between the times t3 and t4 to store the second value. Current flows from the data line 920 to the source 940, and the terminal 960 is the source such that the gate-source voltage difference $V_{GS}$ is approximately −4.5 volts for the access device 930. Through the acts of programming and erasing the gate-source voltage difference $V_{GS}$ is not substantially lower than approximately −4.5 volts so that the access device 930 is not compromised.

Figure 10:
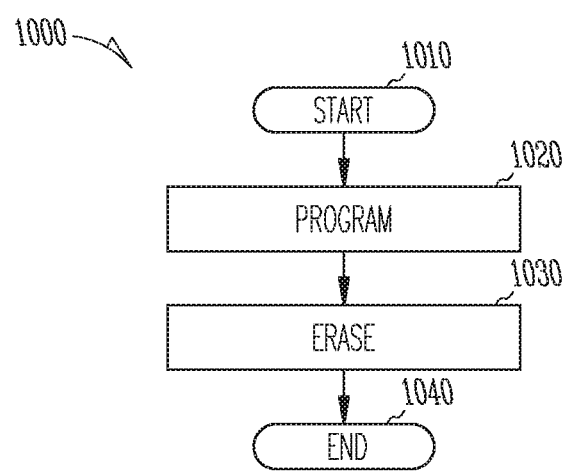
FIG. 10 is a flow diagram of a method according to various embodiments of the invention.

FIG. 10 is a flow diagram of a method 1000 according to various embodiments of the invention. In block 1010, the method 1000 starts. In block 1020, a first access device is switched on with a first control gate voltage and a first data line voltage is provided to a first data line. A first resistance variable element coupled to the first access device is then programmed in a first operation. In block 1030, a second data line voltage is provided to a second data line that is different than the first data line voltage. A second access device is switched on with a second control gate voltage that is different than the first control gate voltage. A second resistance variable element coupled to the second access device is then erased in a second operation. In block 1040, the method 1000 ends. Various embodiments may have more or fewer activities than those shown in FIG. 10. In some embodiments, the activities may be repeated, and/or performed in serial or parallel fashion. Some embodiments may comprise the same activities in a different order.

Figure 11:
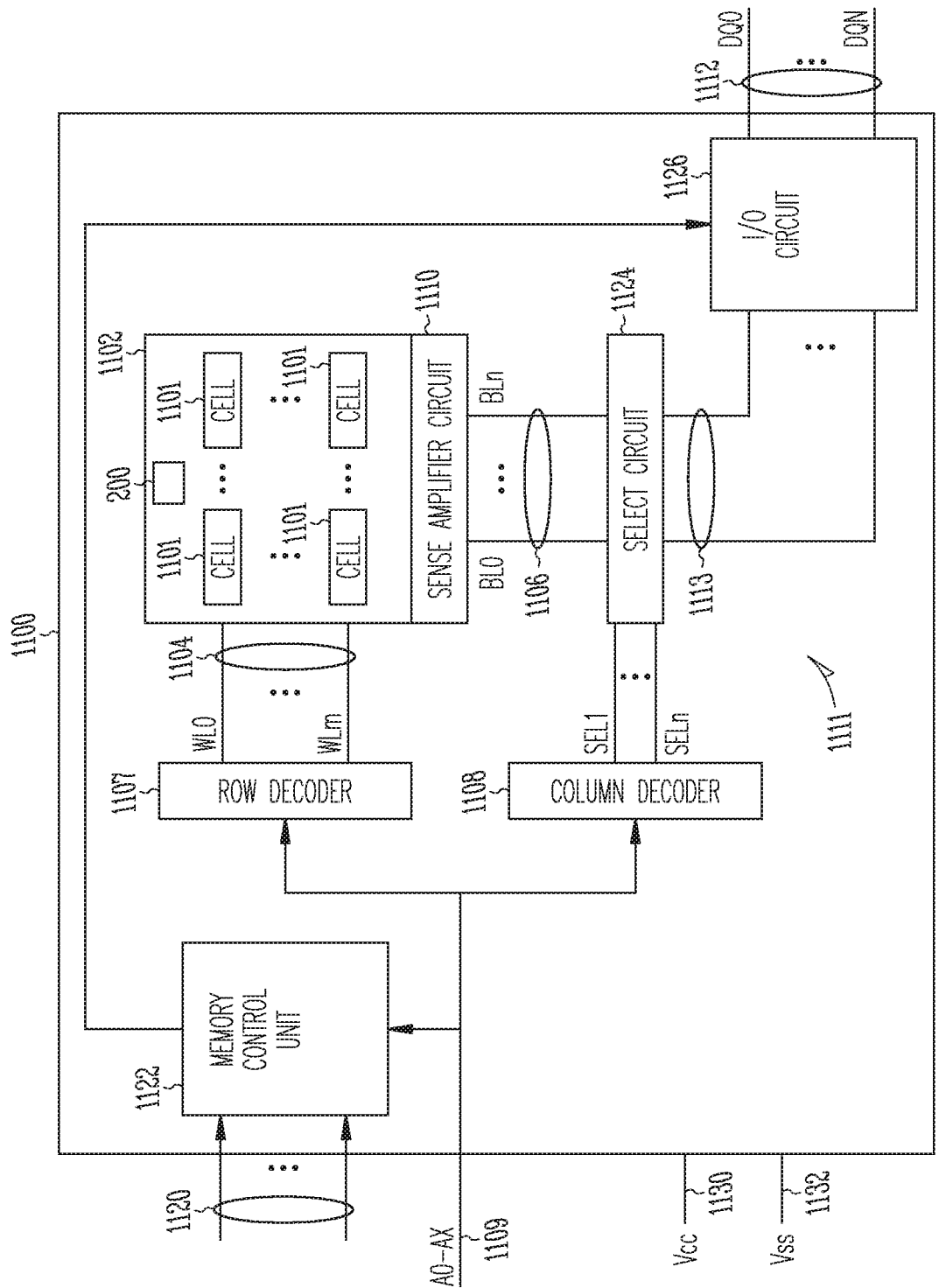
FIG. 11 is a block diagram of an apparatus in the form of a memory device according to various embodiments of the invention.

FIG. 11 is a block diagram of an apparatus in the form of a memory device 1100 according to various embodiments of the invention. The memory device 1100 can include a plurality of memory cells 1101 in a memory array 1102. The memory cells 1101 can be arranged in rows and columns along with access lines 1104 and first data lines 1106. The memory device 1100 can use the access lines 1104 and the first data lines 1106 to transfer data to and from the memory cells 1101. A row decoder 1107 and a column decoder 1108 can decode address signals A0 through AX on address lines 1109 to determine which ones of the memory cells 1101 are to be accessed.

A sense amplifier circuit 1110 can operate to determine the value of data read from memory cells 1101 and the data read is communicated in the form of signals to the first data lines 1106. The sense amplifier circuit 1110 can also use the signals on the first data lines 1106 to determine values of data to be written to the memory cells 1101.

The memory device 1100 can include circuitry 1111 to transfer data between the memory array 1102 and input/output (I/O) lines 1112. Signals DQ0 through DQN on the I/O lines 1112 can represent data read from or written into the memory cells 1101. The I/O lines 1112 can include nodes within the memory device 1100 (or alternatively, pins, solder balls, or other interconnect technologies such as controlled collapse chip connection (C4), or flip chip attach (FCA) on a package where the memory device 1100 can reside. Other devices external to memory device 1100 can communicate with the memory device 1100 through the I/O lines 1112, the address lines 1109, or control lines 1120. For example, such external devices can include a memory controller or a processor.

The memory device 1100 can perform memory operations, such as a read operation, to read data from selected ones of the memory cells 1101, and a write operation to store data into selected ones of the memory cells 1101. A memory control unit 1122 controls memory operations based on signals on the control lines 1120. Examples of the signals on the control lines 1120 can include one or more clock signals and other signals to indicate which operation (e.g., a write or a read operation) the memory device 1100 can or should perform. Other devices external to the memory device 1100 can control the values of the control signals on the control lines 1120. The external devices can include, for example, a processor or a memory controller. Specific values of a combination of the control signals on the control lines 1120 can produce a command, such as a write or read command for example, that can cause the memory device 1100 to perform a corresponding memory operation. The corresponding memory operation can include, for example, a write or a read operation.

Each of the memory cells 1101 can be programmed or erased to store data representing a value of a single bit or a value of multiple bits such as two, three, four, or a higher number of bits. For example, each of the memory cells 1101 can be programmed or erased to store data representing a binary value "0" or "1" of a single bit. The single bit per cell is sometimes called a single level cell. In another example, each of the memory cells 1101 can be programmed or erased to store data representing a value representing multiple bits, such as one of four possible values "00," "01," "10," and "11" of two bits, one of eight possible values "000," "001," "010," "011," "100," "101," "110," and "111" of three bits, or one of another set of values of multiple bits. A cell that has an ability to store multiple bits is sometimes referred to as a multi-level cell or multi-state cell.

The memory device 1100 can receive a supply voltage, including supply voltage signals Vcc and Vss, on a first supply line 1130 and a second supply line 1132, respectively. The supply voltage signal Vss can operate at a ground potential. The ground potential can have a value of approximately zero volts. The supply voltage signal Vcc can include an external voltage supplied to the memory device 1100 from an external power source such as a battery or an alternating current to direct current (AC-DC) converter circuitry.

The circuitry 1111 of memory device 1100 can include a select circuit 1124 and an input/output (I/O) circuit 1126. Select circuit 1124 can respond to signals SEL1 through SELn to select signals on first data lines 1106 and second data lines 1113 that can represent the data read from or to be written into memory cells 1101. Column decoder 1108 can selectively activate the SEL1 through SELn signals based on the A0 through AX address signals on address lines 1109. Select circuit 1124 can select the signals on first data lines 1106 and second data lines 1113 to provide communication between memory array 1102 and I/O circuit 1126 during read and write operations.

The memory cells 1101 can comprise one or more of the resistance variable memory cells 100, 500, 600 and 900 shown in FIGS. 1, 5, 6 and 9, respectively. The memory device 1100 can include the array 200 of resistance variable memory cells shown in FIG. 2 including one or more of the resistance variable memory cells 100, 500, 600 and 900 shown in FIGS. 1, 5, 6 and 9, respectively.

The methods described herein can result in higher drive current from an access device in a resistance variable memory cell. This can lead to a significant performance improvement over conventional technology.

Example structures and methods of resistance variable elements have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A memory system, comprising:
   multiple data lines;
   a common source;
   an array of multiple resistance variable memory cells, each resistance variable memory cell coupled between one of the data lines and the common source, wherein each resistance variable memory cell comprises a resistance variable element and an access device; and
   a memory controller configured to control,
      provision of a standby data line voltage to the data lines;
      performance of a program operation on the resistance variable element of a first resistance variable memory cell, comprising,
         providing the access device of the first resistance variable memory cell with a first control gate voltage, and
         providing a first data line voltage to a data line coupled to the first resistance variable memory cell; and
      performance of an erase operation on the resistance variable element of a second resistance variable memory cell, comprising,
         providing the access device of the second resistance variable memory cell with a second control gate voltage that is greater than the first control gate voltage, and
         providing a second data line voltage that is different than the first data line voltage to a data line coupled to the second resistance variable memory cell.

2. The memory system of claim 1, wherein the memory controller is configured maintain the common source at a common source voltage during both the performance of the program operation and the performance of the erase operation.

3. The memory system of claim 1, wherein the memory controller is configured to selectively provide a common source voltage to the common source; and to selectively provide the standby data line voltage to the data lines which is equal to the common source voltage.

4. The memory system of claim 1, wherein the access devices of the multiple resistance variable memory cells each comprise a field effect transistor (FET) having a gate.

5. The memory system of claim 4, wherein the first and second control gate voltages are each applied to the gates of the FET of each of the first and second resistance variable memory cells, during respective programming and erase operations of the first and second resistance variable memory cells.

6. The memory system of claim 1, wherein the access devices of the multiple resistance variable memory cells are electrically coupled between the resistance variable element of the respective resistance variable memory cell and a bit line associated with the respective resistance variable memory cell.

7. The memory system of claim 1, wherein the access devices of the multiple resistance variable memory cells are electrically coupled between the resistance variable element of the respective resistance variable memory cell and the common source.

8. The memory system of claim 1, wherein the second gate control voltage provided by the memory controller during an erase operation is greater than the first control gate voltage provided by the memory controller during a programming operation.

9. The memory system of claim 8, wherein the second control gate voltage is substantially equal to the first control gate voltage plus the common source voltage.

10. The memory system of claim 1, wherein the first data line voltage is less than the common source voltage.

11. The memory system of claim 1, which is a memory device.

* * * * *